US006498760B2

(12) United States Patent
Yamasaki (10) Patent No.: US 6,498,760 B2
(45) Date of Patent: Dec. 24, 2002

(54) SEMICONDUCTOR DEVICE HAVING TEST MODE (75) Inventor: Kyoji Yamasaki, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/930,174

(22) Filed: Aug. 16, 2001

(65) Prior Publication Data
US 2002/0141261 A1 Oct. 3, 2002

(30) Foreign Application Priority Data
Mar. 30, 2001 (JP) ......................... 2001-097908

(51) Int. Cl.$^7$ ............................. G11C 11/00; G11C 7/00
(52) U.S. Cl. .................. 365/226; 365/201; 365/189.09; 365/189.11; 323/312; 323/313
(58) Field of Search ..................... 365/201, 189.01, 365/189.09, 189.11, 226; 323/312, 313

(56) References Cited

U.S. PATENT DOCUMENTS

| | | | | |
|---|---|---|---|---|
| 5,777,930 A | * | 7/1998 | Sugiura et al. | 365/189.11 |
| 5,847,595 A | * | 12/1998 | Kono et al. | 327/530 |
| 5,917,766 A | * | 6/1999 | Tsuji et al. | 356/201 |
| 6,212,107 B1 | * | 4/2001 | Tsukada | 365/189.09 |
| 6,297,624 B1 | * | 10/2001 | Mitsui et al. | 323/316 |
| 6,424,134 B2 | * | 7/2002 | Morshita et al. | 323/313 |
| 2002/0011826 A1 | * | 1/2002 | Morishita et al. | 323/312 |
| 2002/0021602 A1 | * | 2/2002 | Morishita et al. | 365/201 |

* cited by examiner

Primary Examiner—Viet Q. Nguyen
(74) Attorney, Agent, or Firm—McDermott, Will & Emery (57) ABSTRACT An internal power supply potential generating circuit of a DRAM sets, at the time of a burn-in test, a first internal power supply potential for a wordline to an external power supply potential, maintains an internal power supply potential for a sense amplifier at an external reference potential, and maintains a second internal power supply potential for a peripheral circuit at a potential higher than the external reference potential only by a predetermined voltage. An early defect in a circuit portion to which the first internal power supply potential is applied and that in a circuit portion to which the second internal power supply potential is applied can be therefore accelerated separately from each other. Thus, a test efficiency is increased.

8 Claims, 9 Drawing Sheets

SEMICONDUCTOR DEVICE HAVING TEST MODE

BACKGROUND OF THE INVENTION

1. Field of the Invention

The present invention relates to a semiconductor device and, more particularly, a semiconductor device having a test mode driven by an external power supply potential.

2. Description of the Background Art

Conventionally, in a dynamic random access memory (hereinbelow, abbreviated as DRAM), packing density is being increased and power supply voltage is being decreased. For this purpose, the DRAM is provided with an internal power supply potential generating circuit for generating an internal power supply potential by dropping the external power supply potential. In the DRAM, to reject an early defective piece in which a defect occurs relatively early after shipment, a burn-in test is carried out before shipment. In the burn-in test, an internal power supply potential higher than that in a normal mode is applied, and data is written/read to/from each of memory cells under high-temperature environment. It accelerates the occurrence of a defective, so that an early defective piece can be prevented from being shipped.

Figure 10:
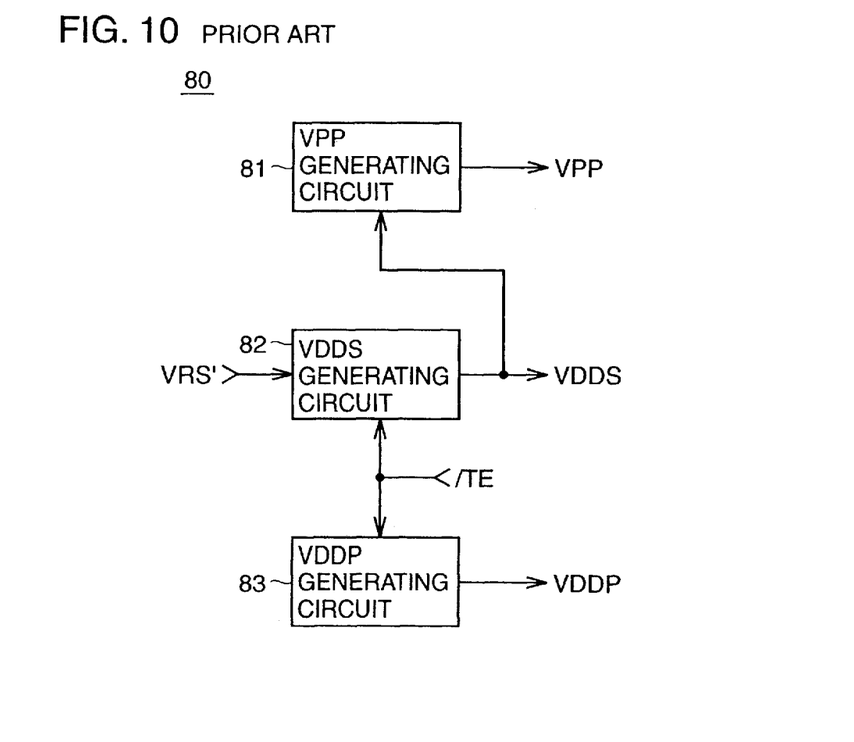
FIG. 10 is a block diagram showing the configuration of an internal power supply potential generating circuit of a conventional DRAM.

FIG. 10 is a block diagram showing the configuration of such an internal power supply potential generating circuit 80 of a DRAM. In FIG. 10, the internal power supply potential generating circuit 80 includes a VPP generating circuit 81, a VDDS generating circuit 82, and a VDDP generating circuit 83.

Figure 11:
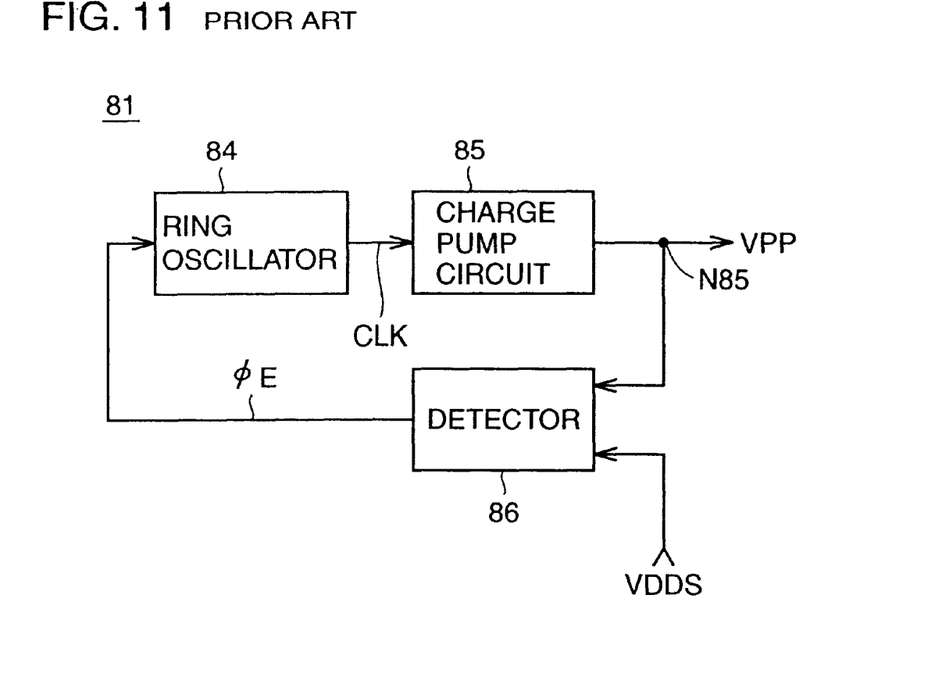
FIG. 11 is a block diagram showing the configuration of a VPP generating circuit illustrated in FIG. 10.

The VPP generating circuit 81 includes, as shown in FIG. 11, a ring oscillator 84, a charge pump circuit 85, and a detector 86. The detector 86 receives both a potential VPP of a power supply node N85 and an internal power supply potential VDDS from the VDDS generating circuit 82. When VPP<VDDS+2Vthn (where Vthn denotes a threshold voltage of an N-channel MOS transistor), the detector 86 sets a signal φE to the "H" level. When VPP≧VDDS+2Vthn, the detector 86 sets the signal φE to the "L" level. When the signal φE is at the "H" level, the ring oscillator 84 generates a clock signal CLK and supplies it to the charge pump circuit 85. When the signal φE is at the "L" level, the ring oscillator 84 is made inactive. The charge pump circuit 85 supplies a predetermined amount of positive charges to the power supply node N85 in response to the rising edge of the clock signal CLK.

When VPP<VDDS+2Vthn, the positive charges are supplied from the charge pump circuit 85 to the power supply node N85. When VPP≧VDDS+2Vthn, the supply of power from the charge pump circuit 85 to the power supply node N85 is stopped. The potential VPP at the power supply node N85 is therefore maintained at VDDS+2Vthn. The internal power supply potential VPP is used as a wordline selection level.

Figure 12:
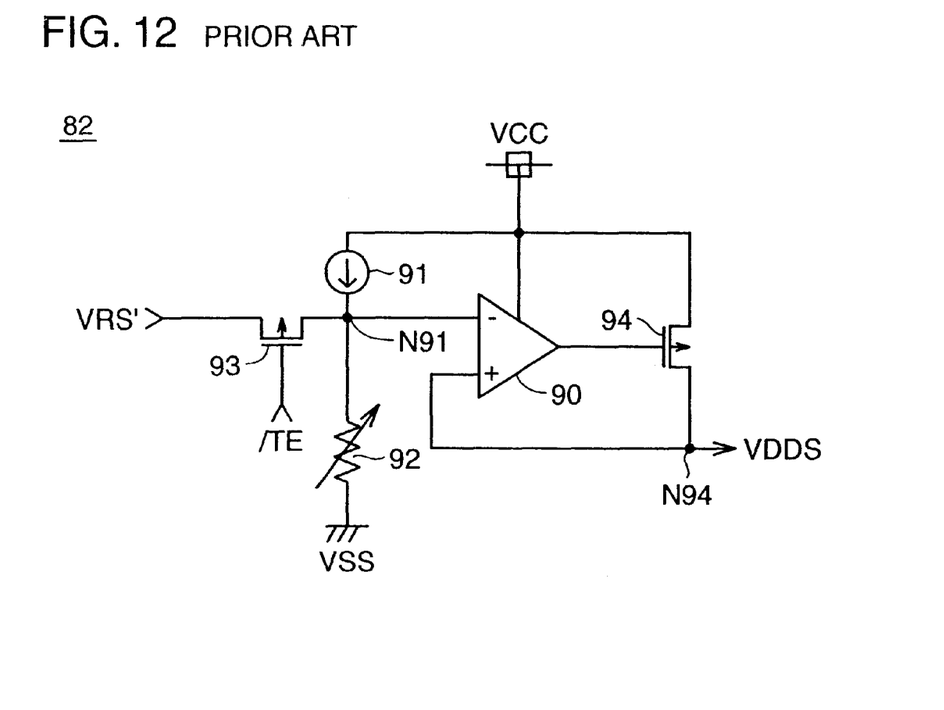
FIG. 12 is a circuit diagram showing the configuration of a VDDS generating circuit illustrated in FIG. 10.

The VDDS generating circuit 82 includes, as shown in FIG. 12, an operational amplifier 90, a constant current source 91, a variable resistive element 92, and P-channel MOS transistors 93 and 94. The constant current source 91 and the variable resistive element 92 are connected in series between a line of the external power supply potential VCC and a line of a ground potential VSS. The P-channel MOS transistor 93 has the source for receiving an external reference potential VRS', the drain connected to a node N91 between the constant current source 91 and the variable resistive element 92, and the gate for receiving a test signal ITE.

The P-channel MOS transistor 94 is connected between the line of the external power supply potential VCC and a power supply node N94. The operational amplifier 90 has an inversion input terminal connected to the node N91, a non-inversion input terminal connected to the power supply node N94, and the output terminal connected to the gate of the P-channel MOS transistor 94. The operational amplifier 90 and the P-channel MOS transistor 94 construct a voltage follower for maintaining the potential VDDS at the power supply node N94 at the same level as the potential at the node N91. The internal power supply potential VDDS is applied to a sense amplifier.

At the time of tuning, the test signal /TE is set to the "H" level as an inactivate level, and the P-channel MOS transistor 93 is made non-conductive. The resistance value of the variable resistive element 92 is tuned so that the internal power supply potential VDDS becomes equal to a predetermined value VRS.

At the time of a burn-in test, the test signal /TE is set to the "H" level as an activate level, the P-channel MOS transistor 93 is made conductive, and the internal power supply potential VDDS becomes equal to the external reference potential VRS' (>VRS). The internal power supply potential VPPS becomes equal to VRS'+2Vthn. In normal operation, the test signal /TE is set to the "H" level as an inactivate level, the P-channel MOS transistor 93 is made non-conductive, and the internal power supply potential VDDS becomes VRS. The internal power supply potential VPP becomes equal to VRS+2Vthn.

Figure 13:
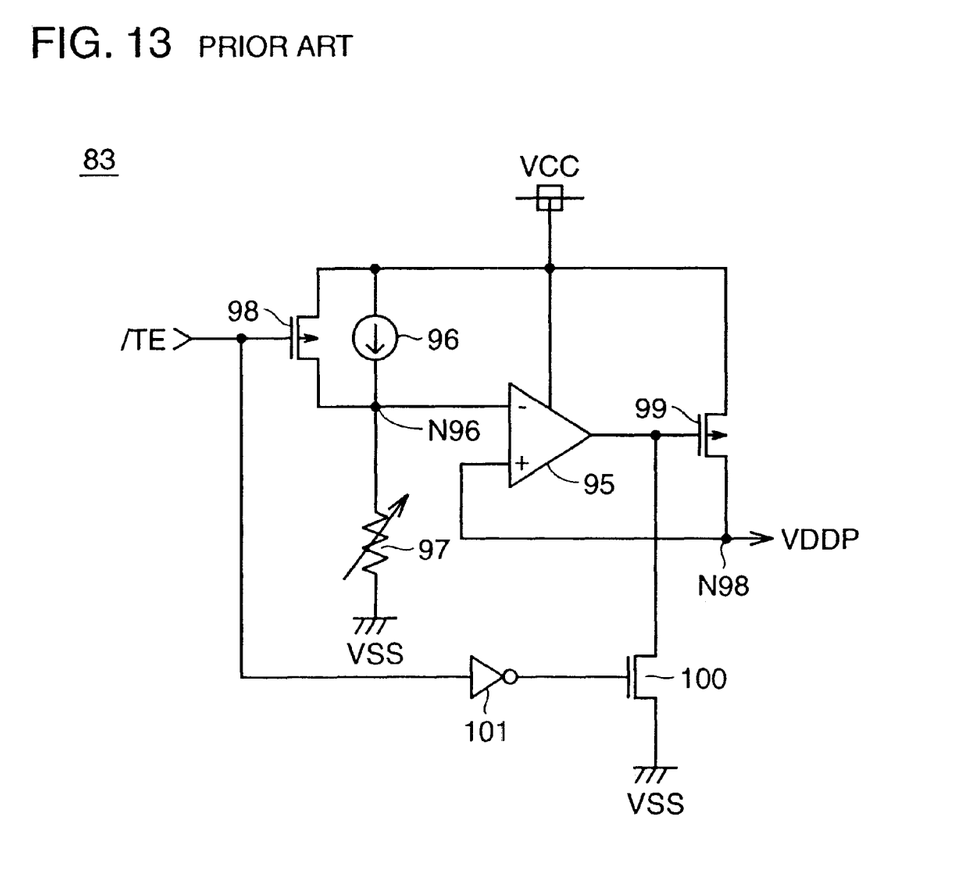
FIG. 13 is a circuit diagram showing the configuration of a VDDP generating circuit illustrated in FIG. 10.

The VDDP generating circuit 83 includes, as shown in FIG. 13, an operational amplifier 95, a constant current source 96, a variable resistive element 97, P-channel MOS transistors 98 and 99, an N-channel MOS transistor 100, and an inverter 101. The constant current source 96 and the variable resistive element 97 are connected in series between the line of the external power supply potential VCC and the line of the ground potential VSS. The P-channel MOS transistor 99 is connected between the line of the external power supply potential VCC and a power supply node N98. The operational amplifier 95 has an inversion input terminal connected to a node N96 between the constant current source 96 and the variable resistive element 97, a non-inversion input terminal connected to the power supply node N98, and an output terminal connected to the gate of the P-channel MOS transistor 99. The operational amplifier 95 and the P-channel MOS transistor 99 construct a voltage follower which maintains the potential VDDP of the power supply node N98 to the level same as the potential of the node N96. The internal power supply potential VDDP is supplied to peripheral circuits.

The P-channel MOS transistor 98 is connected in parallel with the constant current source 96. The N-channel MOS transistor 100 is connected between the gate of the P-channel MOS transistor 99 and the line of the ground potential VSS. The test signal ITE is directly supplied to the gate of the P-channel MOS transistor 98 and also to the gate of the N-channel MOS transistor 100 via the inverter 101.

At the time of tuning, the test signal /TE is set to the "H" level as an inactivate level, and the MOS transistors 98 and 100 are made non-conductive. The resistance value of the variable resistive element 97 is tuned so that the internal power supply potential VDDP becomes equal to a predetermined value VRP (>VRS).

At the time of a burn-in test, the test signal /TE is set to the "L" level as an activate level, the MOS transistors 98 and 100 are made conductive, and the internal power supply potential VDDP becomes equal to the external power supply potential VCC. In normal operation, the test signal /TE is set to the "H" level as an inactivate level, the MOS transistors 98 and 100 are made non-conductive, and the internal power supply potential VDDP becomes VRP.

In short, in normal operation, VPP=VRS+2Vthn, VDDS=VRS, and VDDP=VRP. At the time of the burn-in test, VPP=VRS'+2Vthn, VDDS=VRS', and VDDP=VCC. VRS and VRP are tuned.

In the conventional internal power supply potential generating circuit 80, however, VPP is equal to VDDS+2Vthn. Consequently, VPP and VDDS cannot be set independently of each other. Occurrence of an early defective in a circuit portion to which VPP is applied and that in a circuit portion to which VDDS is applied cannot be separately accelerated, so that test efficiency is low.

The resistance values of the two variable resistive elements 92 and 97 have to be tuned. The tuning is, however, troublesome.

SUMMARY OF THE INVENTION

It is, therefore, an object of the invention to provide a semiconductor device having high test efficiency.

Another object of the invention is to provide a semiconductor device capable of easily adjusting an internal reference potential.

A semiconductor device according to the invention includes: a first reference potential generating circuit of which output potential is adjustable, for outputting a first internal reference potential which is lower than the external power supply potential; a first power supply circuit for maintaining a first power supply node at the first internal reference potential in a normal operation mode, and maintaining the first power supply node at an external reference potential in a test mode; a second power supply circuit for maintaining a second power supply node at a boosted potential higher than the first internal reference potential by a predetermined first voltage in the normal operation mode, and supplying the external power supply potential to the second power supply node in the test mode; a level shifting circuit for outputting a potential obtained by level-shifting the potential of the first power supply node by a predetermined second voltage to the external power supply potential side; a third power supply circuit for maintaining a third power supply node at an output potential of the level shifting circuit; and an internal circuit for receiving a drive power from the first to third power supply circuits via the first to third power supply nodes and performing a predetermined operation. Consequently, in the test mode, the first power supply node is maintained at the first external reference potential and the second power supply node is maintained at the external power supply potential, so that occurrence of a defect in the circuit portion to which the potential of the first power supply node is applied and that in the circuit portion to which the potential of the second power supply node is applied can be accelerated separately from each other. Thus, the test efficiency is increased. Since it is sufficient to adjust only the first internal reference potential, as compared with the conventional technique in which two internal reference potentials have to be adjusted, the internal reference potential can be easily adjusted.

Preferably, the first reference potential generating circuit includes: a first constant current source connected between a line of the external power supply potential and a first output node, for supplying a predetermined first current to the first output node; and a first variable resistive element of which resistance value is adjustable, which is connected between the first output node and a line of a ground potential. In this case, by adjusting the resistance value of the first variable resistive element, the first internal reference potential can be adjusted.

Preferably, the second power supply circuit includes: a charge pump circuit which is activated when a potential of the second power supply node is lower than the boosted potential in the normal operation mode and supplies a current to the first power supply node; and a switching element which is connected between a line of the external power supply potential and the second power supply node and is made conductive in the test mode. In this case, the second power supply circuit can be easily constructed.

Preferably, the level shifting circuit includes: a second constant current source which is connected between the line of the external power supply potential and a second output node and supplies a predetermined second current to the second output node; and a transistor connected between the second output node and the line of the ground potential, of which input electrode receives the potential of the first power supply node. In this case, the predetermined second voltage is used as a threshold voltage of the transistor.

Preferably, there is provided a second reference potential generating circuit of which output potential is adjustable, for outputting a second internal reference potential which lies between the external power supply potential and the first internal reference potential, and the third power supply circuit maintains the third power supply node at the second internal reference potential in the normal operation mode, and maintains the third power supply node at an output potential of the level shifting circuit in the test mode. In this case, the potential of the third power supply node in the normal operation mode can be finely adjusted, so that the internal circuit is allowed to operate with high precision.

Preferably, the semiconductor device further includes: a second reference potential generating circuit of which output potential is adjustable, for outputting a second internal reference potential which lies between the external power supply potential and the first internal reference potential; and a selecting circuit for selecting either an output potential of the level shifting circuit or the second internal reference potential, and the third power supply circuit maintains the third power supply node at a potential selected by the selecting circuit. In this case, when the output potential of the level shifting circuit is selected, the internal reference potential can be easily adjusted but the precision of the operation of the internal circuit deteriorates. On the other hand, when the second reference potential is selected, the adjustment of the internal reference potential becomes troublesome, but the internal circuit is allowed to operate with high precision.

Preferably, the second reference potential generating circuit includes: a third constant current source connected between a line of the external power supply potential and a third output node, for supplying a predetermined third current to the third output node; and a second variable resistive element connected between the third output node and the line of the ground potential, of which resistance value is adjustable. In this case, by adjusting the resistance value of the second variable resistive element, the second internal reference potential can be adjusted.

Preferably, the semiconductor device is a semiconductor memory device, and a sense amplifier receives a drive power from the first power supply circuit via the first power supply node, the wordline selected by the row selecting circuit receives a drive power from the second power supply circuit via the second power supply node, and the row selecting circuit, the column selecting circuit, and the write/read circuit receive a drive power from the third power supply circuit via the third power supply node. The present invention is particularly effective on this case.

A semiconductor device according to another aspect of the invention includes: a first power supply circuit for generating a first internal power supply potential lower than the external power supply potential; a level shifting circuit for outputting a potential obtained by level-shifting the first internal power supply potential by a predetermined voltage to the external power supply potential side; a second power supply circuit for maintaining a second internal power supply potential at the same level as a predetermined reference potential in a normal operation mode, and maintaining the second internal power supply potential at the same level as an output potential of the level shifting circuit in a test mode; and an internal circuit which is driven by first and second internal power supply potentials generated by the first and second power supply circuits and performs a predetermined operation. In the test mode, the second internal power supply potential is maintained at a potential obtained by level-shifting the first internal power supply potential only by a predetermined voltage, so that the level of the second,internal power supply potential can be easily set, and the test efficiency is increased. In the normal operation mode, since the second internal power supply potential is maintained at the predetermined reference potential, the internal circuit is allowed to operate with high precision.

Preferably, the predetermined reference potential is a potential between the external power supply potential and the first internal power supply potential. In this case, the reference potential can easily be generated.

Preferably, the semiconductor device according to the present invention further includes a reference potential generating circuit of which output potential is adjustable, for outputting the predetermined reference potential. The reference potential generating circuit includes: a first constant current source connected between a line of the external power supply potential and a first output node, for supplying a predetermined first current to the first output node; and a variable resistive element connected between the first output node and a line of a ground potential, of which resistance value is adjustable. In this case, by adjusting the resistance value of the variable resistive element, the potential can be adjusted to the reference potential.

Preferably, the level shifting circuit includes: a second constant current source connected between a line of the external power supply potential and a second output node, for supplying a predetermined second current to the second output node; and a first transistor connected between the second output node and the line of the ground potential, of which input electrode receives the first internal power supply potential. In this case, the predetermined voltage is a threshold voltage of the first transistor.

Preferably, the second power supply circuit includes: a switching circuit for supplying the reference potential to a third output node in the normal operation mode and supplying an output potential of the level shifting circuit to the third output node in the test mode; a second transistor connected between the line of the external power supply potential and a fourth output node; and a control circuit for controlling an input voltage of the second transistor so that the potentials of the third and fourth output nodes coincide with each other, and the potential of the fourth output node becomes equal to the second internal power supply potential. In this case, the second power supply circuit can be easily constructed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
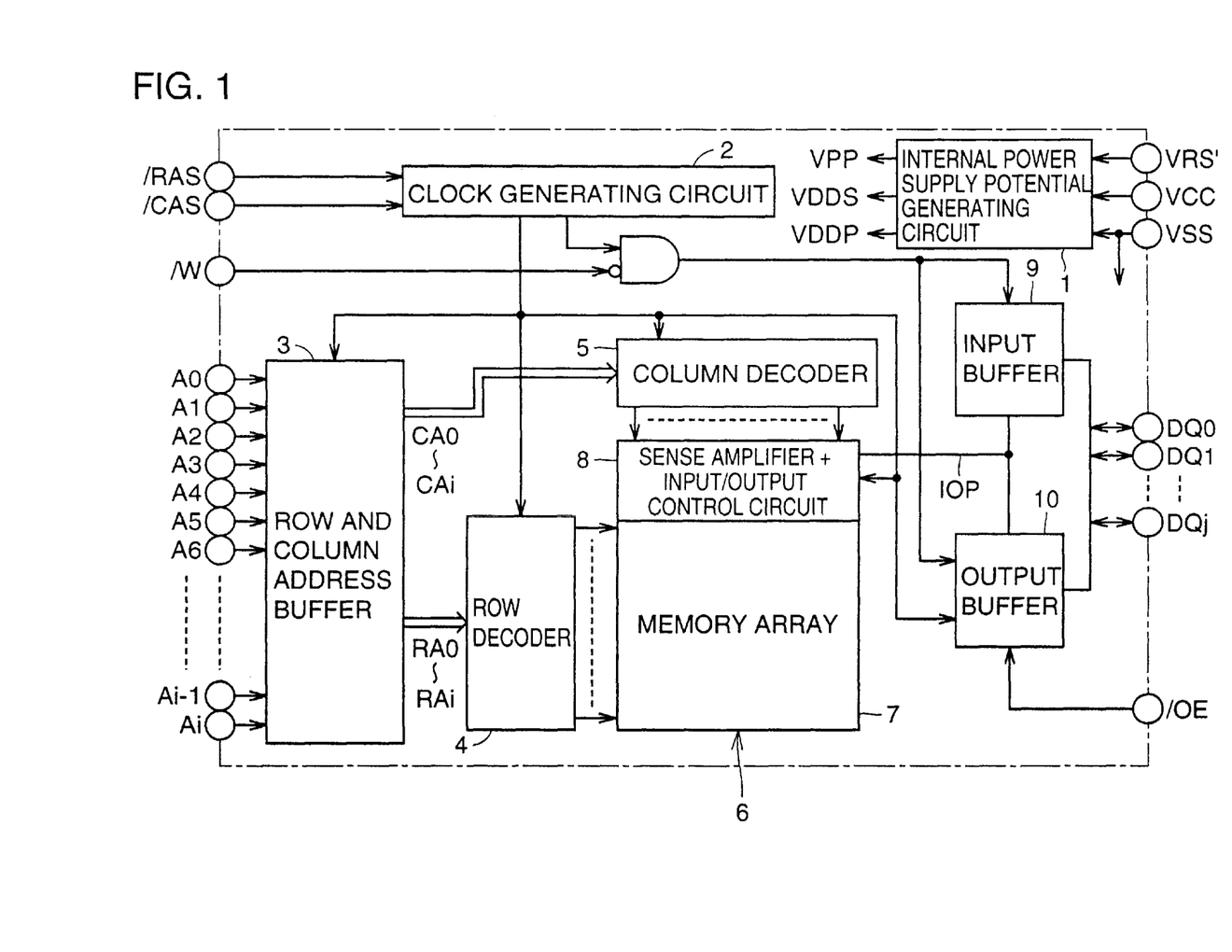
FIG. 1 is a block diagram showing the configuration of a whole DRAM according to a first embodiment of the invention.

FIG. 1 is a block diagram showing the configuration of a whole DRAM according to a first embodiment of the invention. In FIG. 1, the DRAM includes an internal power supply potential generating circuit 1, a clock generating circuit 2, a row and column address buffer 3, a row decoder 4, a column decoder 5, a memory mat 6, an input buffer 9, and an output buffer 10. The memory mat 6 includes a memory array 7 and a sense amplifier and input/output control circuit 8.

The internal power supply potential generating circuit 1 generates internal power supply potentials VPP, VDDS, and VDDP on the basis of a power supply potential VCC, a ground potential VSS, and a reference potential VRS' which are supplied from the outside, and supplies the generated internal power supply potentials to the whole DRAM. The clock generating circuit 2 selects a predetermined operation mode in accordance with external control signals /RAS and /CAS to control the whole DRAM.

The row and column address buffer 3 generates row address signals RA0 to RAi and column address signals CA0 to CAi in accordance with external address signals A0 to Ai (where i denotes an integer of 0 or larger), and supplies the generated signals RA0 to RAi and CA0 to CAi to the row decoder 4 and the column decoder 5, respectively.

The memory array 7 includes a plurality of memory cells each for storing one-bit data. Each of the memory cells is disposed in a predetermined address determined by a row address and a column address.

The row decoder 4 designates a row address in the memory array 7 in accordance with the row address signals RA0 to RAi supplied from the row and column address buffer 3. The column decoder 5 designates a column address in the memory array 7 in accordance with the column address signals CA0 to CAi supplied from the row and column address buffer 3.

The sense amplifier and input/output control circuit 8 connects the memory cell of the address designated by the row decoder 4 and the column decoder 5 to one end of a data input/output line pair IOP. The other end of the data input/output pair IOP is connected to the input buffer 9 and the output buffer 10. The input buffer 9 supplies data Dj (where j denotes an integer of 0 or larger) supplied from the outside to the selected memory cell via the data input/output line pair IOP in response to an external control signal /W in a writing mode. The output buffer 10 outputs read data Qj from the selected memory cell to the outside in response to an external control signal /OE in a reading mode.

Figure 2:
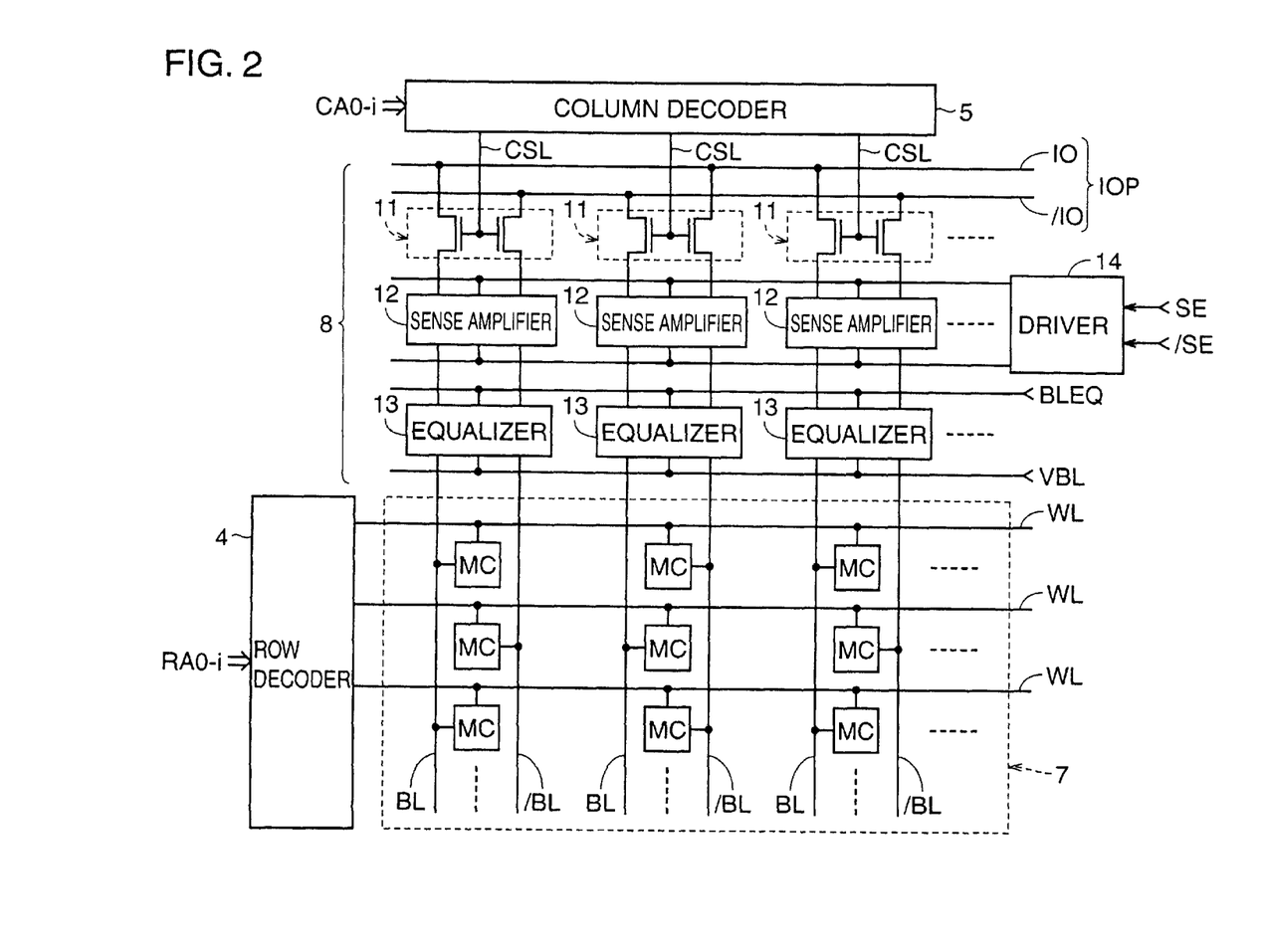
FIG. 2 is a circuit block diagram showing the configuration of a memory mat illustrated in FIG. 1.
Figure 3:
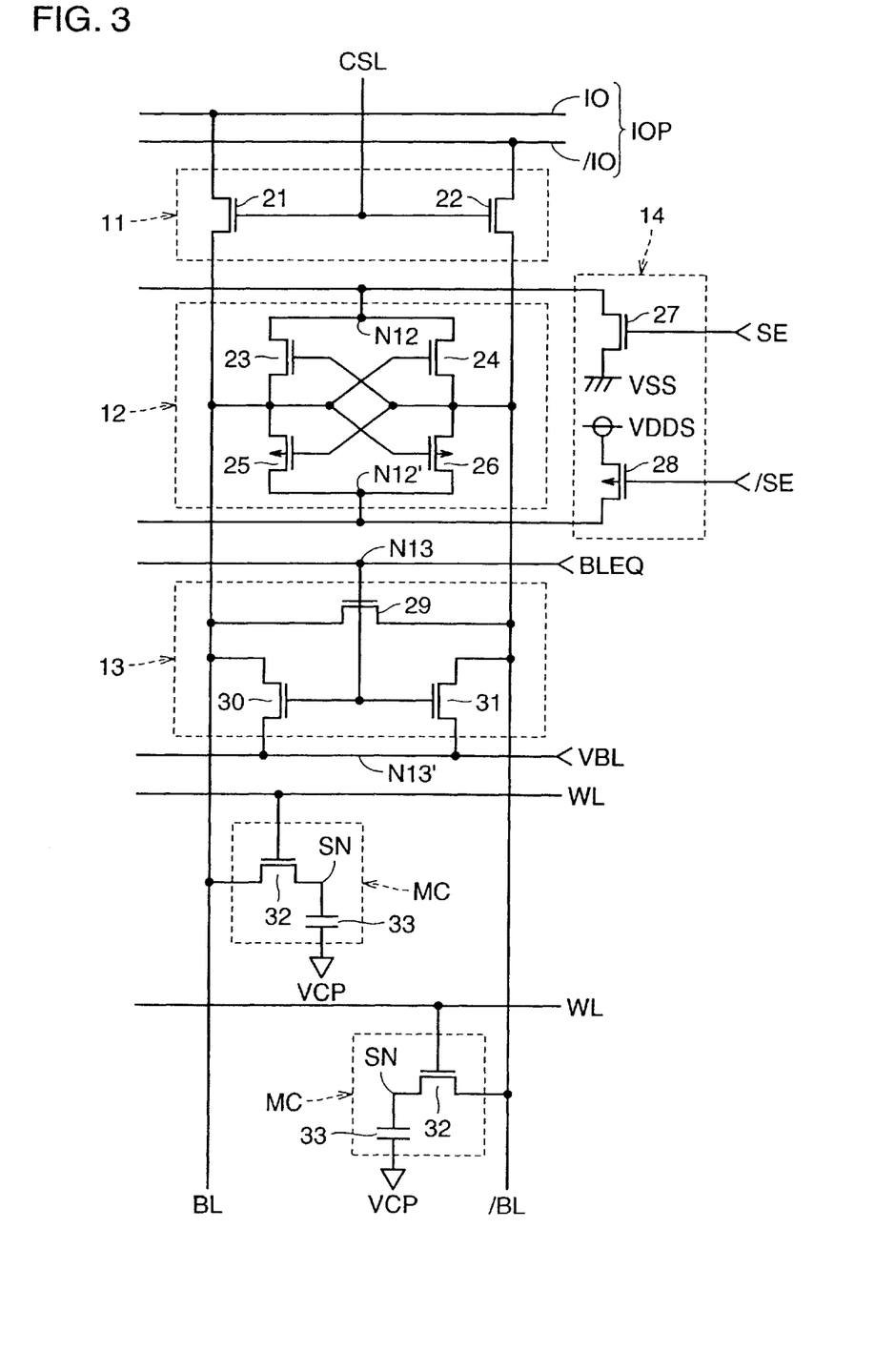
FIG. 3 is a circuit diagram showing the configuration of a sense amplifier and input/output control circuit illustrated in FIG. 2.

FIG. 2 is a circuit block diagram showing the configuration of the memory array 7 and the sense amplifier and input/output control circuit 8 in the DRAM illustrated in FIG. 1. FIG. 3 is a circuit diagram specifically showing the configuration of one of columns in the memory array 7 and the sense amplifier and input/output control circuit 8 illustrated in FIG. 2.

Referring to FIGS. 2 and 3, the memory array 7 includes a plurality of memory cells MC arranged in a matrix, wordlines WL provided in correspondence with the rows, and pairs of bit lines BL and /BL provided in correspondence with the columns. Each of the memory cells MC includes an N-channel MOS transistor 32 for access and a capacitor 33 for storing information. The gate of the N-channel MOS transistor 32 in each memory cell MC is connected to the wordline WL of the corresponding row. The N-channel MOS transistor 32 is connected between the bit line BL or /BL of the corresponding column and one (storage node SN) of the electrodes of the capacitor 33 of the memory cell MC. The other electrode of the capacitor 33 of the memory cell MC receives a cell plate potential VCP. One end of each wordline WL is connected to the row decoder 4.

The sense amplifier and input/output control circuit 8 includes a column selection line CSL provided corresponding to each column, a column selection gate 11, a sense amplifier 12, an equalizer 13, a driver 14, and a pair (IOP) of data input/output lines IO and /IO. The column selection gate 11 includes N-channel MOS transistors 21 and 22 connected between the bit lines BL and /BL and the data input/output lines IO and /IO. The gates of the N-channel MOS transistors 21 and 22 are connected to the column decoder 5 via the column selection line CSL. When the column selection line CSL is raised to the "H" level of the selection level by the column decoder 5, the N-channel MOS transistors 21 and 22 are made conductive, and the pair of bit lines BL and /BL and the pair of data input/output lines IO and /IO are coupled.

The sense amplifier 12 includes N-channel MOS transistors 23 and 24 connected between the bit lines BL and /BL and a node N12, and P-channel MOS transistors 25 and 26 connected between the bit lines BL and /BL and a node N12'. The gates of the MOS transistors 23 and 25 are connected to the bit line /BL, and the gates of the MOS transistors 24 and 26 are connected to the bit line BL. The driver 14 includes an N-channel MOS transistor 27 connected between the node N12 and the line of the ground potential VSS and a P-channel MOS transistor 28 connected between the node N12' and the line of the internal power supply potential VDDS. The gates of the MOS transistors 27 and 28 receive sense amplifier activate signals SE and /SE, respectively. When the sense amplifier activate signals SE and /SE go high and low, respectively, the MOS transistors 27 and 28 are made conductive, the nodes N12 and N12' have the ground potential VSS and the internal power supply potential VDDS, respectively, and the sense amplifier 12 amplifies a very small potential difference between the pair of bit lines BL and /BL to the internal power supply voltage VDDS.

The equalizer 13 includes an N-channel MOS transistor 29 connected between the bit lines BL and /BL and N-channel MOS transistors 30 and 31 connected between the bit lines BL and /BL and a node N13'. The gates of the N-channel MOS transistors 29 to 31 are connected to a node N13. The node N13 receives a bit line equalize signal BLEQ, and the node N13' receives a bit line potential VBL (=VDDS/2). When the bit line equalize signal BLEQ becomes at the "H" level as an activate level, the equalizer 13 equalizes the potentials of the bit lines BL and /BL to the bit line potential VBL.

The operation of the DRAM shown in FIGS. 1 to 3 will now be described. In a write mode, the column selection line CSL of the column according to the column address signals CA0 to CAi is raised to the "H" level of the selection level by the column decoder 5, and the column selection gate 11 of the column is made conductive.

The input buffer 9 supplies the write data Dj given from the outside to the pair of bit lines BL and /BL in the selected column via the data input/output line pair IOP in response to the signal /W. The write data Dj is given as a potential difference between the bit lines BL and /BL. Subsequently, the wordline WL of the row corresponding to the row address signals RA0 to RAi is raised to the "H" level (internal power supply potential VPP) as the selection level by the row decoder 4, and the MOS transistor 32 in the memory cell MC of the row is made conductive. In the capacitor 33 in the selected memory cell MC, charges according to the potential of the bit line BL or /BL are accumulated.

In a read mode, first, the bit line equalize signal BLEQ is decreased to the "L" level, the N-channel MOS transistors 29 to 31 in the equalizer 13 are made non-conductive, and the operation of equalizing the bit lines BL and /BL is stopped. Subsequently, the wordline WL in the row corresponding to the row address signals RA0 to RAi is raised to the "H" level as the selection level by the row decoder 4. In response to this, the potentials of the bit lines BL and /BL change only by a very small amount in accordance with the charge amount of the capacitor 33 in the activated memory cell MC.

The sense amplifier activate signals SE and /SE go high and low, respectively, and the sense amplifier 12 is activated. When the potential of the bit line BL is higher than that of the bit line /BL only by a small amount, the resistance values of the MOS transistors 24 and 25 become lower than those of the MOS transistors 23 and 26, the potential of the bit line BL is raised to the "H" level (internal power supply potential VDDS), and the potential of the bit line /BL is lowered to the "L" level (ground potential VSS). On the contrary, when the potential of the bit line /BL is higher than that of the bit line BL only by a very small amount, the resistance values of the MOS transistors 23 and 26 become lower than those of the MOS transistors 24 and 25, the potential of the bit line /BL is raised to the "H" level, and the potential of the bit line BL is lowered to the "L" level.

The column selection line CSL of the column corresponding to the column address signals CA0 to CAi is raised to the "H" level as the selection level by the column decoder 5, and the column selection gate 11 of the column is made conductive. Data of the pair of bit lines BL and /BL of the selected column is given to the output buffer 10 via the column selection gate 11 and the pair of data input/output lines IO and /IO. The output buffer 10 outputs the read data Qj to the outside in response to the signal /OE.

Figure 4:
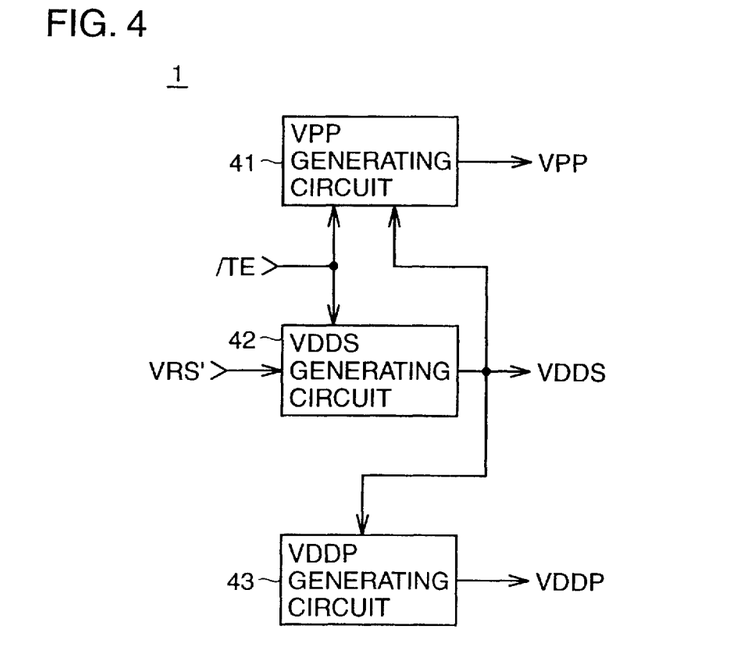
FIG. 4 is a block diagram showing the configuration of an internal power supply potential generating circuit illustrated in FIG. 1.

The internal power supply potential generating circuit 1 as a feature of the invention will be described in detail hereinbelow. The internal power supply potential generating circuit 1 includes, as shown in FIG. 4, a VPP generating circuit 41, a VDDS generating circuit 42, and a VDDP generating circuit 43.

Figure 5:
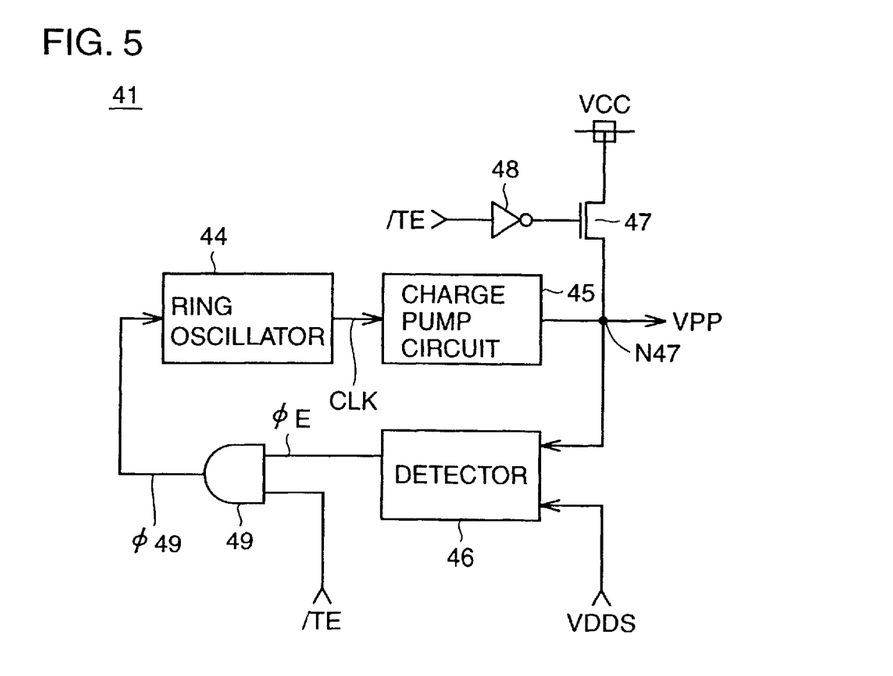
FIG. 5 is a circuit block diagram showing the configuration of a VPP generating circuit illustrated in FIG. 4.

The VPP generating circuit 41 includes, as shown in FIG. 5, a ring oscillator 44, a charge pump circuit 45, a detector 46, an N-channel MOS transistor 47, an inverter 48, and an AND gate 49. The ring oscillator 44 is activated when an output signal $\phi 49$ of the AND gate 49 goes high, generates a clock signal CLK, and supplies the clock signal CLK to the charge pump circuit 45. The charge pump circuit 45 is driven by the clock signal CLK and supplies a predetermined amount of positive charges to a power supply node N47 in response to the rising edge of the clock signal CLK.

The N-channel MOS transistor 47 is connected between the line of the external power supply potential VCC and the power supply node N47. The test signal /TE is supplied to the gate of the N-channel MOS transistor 47 via the inverter 48. The detector 46 receives both the potential VPP of the power supply node N47 and the internal power supply potential VDDS generated by the VDDS generating circuit 42. When VPP<VDDS+2Vthn, the detector 46 sets the signal $\phi E$ to the "H" level. When VPP≧VDDS+2Vthn, the detector 46 sets the signal $\phi E$ to the "L" level. The AND gate 49 receives the test signal /TE and the output signal $\phi E$ of the detector 46, and supplies the signal $\phi 49$ to the ring oscillator 44.

At the time of a burn-in test, the test signal /TE is set to the "L" level, the output signal $\phi 49$ of the AND gate 49 is fixed to the "L" level, the ring oscillator 44 is made inactive, and the driving of the charge pump circuit 45 is stopped. The N-channel MOS transistor 47 is made conductive, and the potential VPP of the power supply node N47 is equalized to the external power supply potential VCC.

In a normal operation, the test signal /TE is set to the "H" level, the output signal $\phi E$ of the detector 46 passes through the AND gate 49 and becomes the signal $\phi 49$, and the N-channel MOS transistor 47 is made nonconductive. When the potential VPP of the power supply node N47 is lower than VDDS+2Vthn, the signals $\phi E$ and $\phi 49$ go high, the ring oscillator 44 is made active, and positive charges are supplied from the charge pump circuit 45 to the power supply node N47. When the potential VPP of the power supply node N47 becomes equal to or higher than VDDS+2Vthn, the signals $\phi E$ and $\phi 49$ go low, the ring oscillator 44 is made inactive, and the supply of positive charges from the charge pump circuit 45 to the power supply node N47 is stopped. The potential VPP of the power supply node N47 is therefore maintained at VDDS+2Vthn. The potential VPP of the power supply node N47 is supplied to the selected wordline WL. VPP is set to be equal to VDDS+2Vthn for the reason that, by suppressing a voltage drop of the N-channel MOS transistor 32 in the memory cell MC, a sufficiently high potential is applied to the storage node SN.

Referring again to FIG. 4, the VDDS generating circuit 42 has the same configuration as that of the conventional VDDS generating circuit 82 shown in FIG. 12. At the time of a burn-in test, the internal power supply potential VDDS is maintained at the same level as the external reference potential VRS'. At the time of normal operation, the internal power supply potential VDDS is maintained at the same level as the internal reference potential VRS. The internal power supply potential VDDS is supplied to the sense amplifier 12 via the driver 14 and also to the VDDP generating circuit 43.

Figure 6:
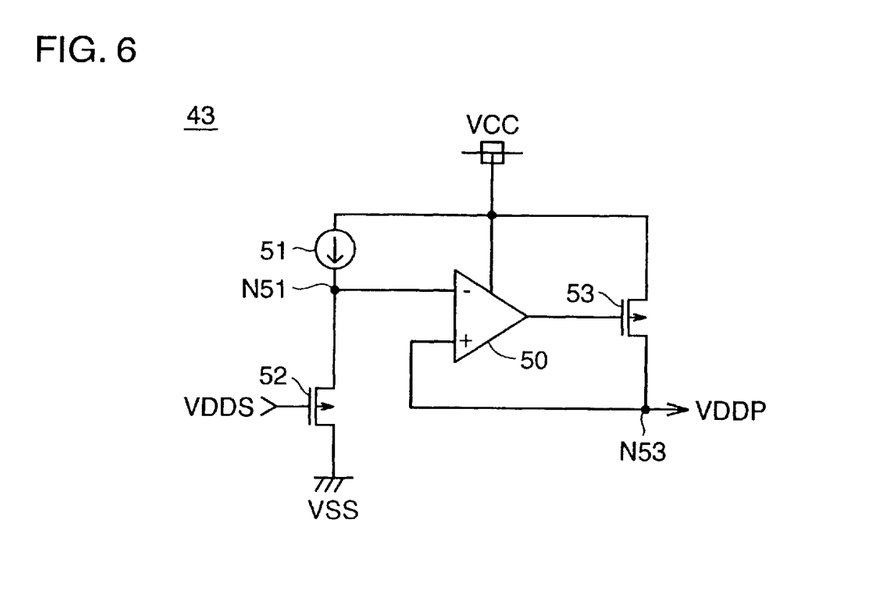
FIG. 6 is a circuit diagram showing the configuration of a VDDP generating circuit illustrated in FIG. 4.

The VDDP generating circuit 43 includes, as shown in FIG. 6, an operational amplifier 50, a constant current source 51, and P-channel MOS transistors 52 and 53. The constant current source 51 and the P-channel MOS transistor 52 are connected in series between the line of the external power supply potential VCC and the line of the ground potential VSS, and the gate of the P-channel MOS transistor 52 receives the internal power supply potential VDDS from the VDDS generating circuit 42. The potential of the source (node N51) of the P-channel MOS transistor 52 is equal to VDDS+Vthp (where Vthp denotes a threshold voltage of the Pchannel MOS transistor). The P-channel MOS transistor 53 is connected between the line of the external power supply potential VCC and the power supply node N53. The operational amplifier 50 has an inversion input terminal connected to the node N51, the non-inversion input terminal connected to the node N53, and an output terminal connected to the gate of the P-channel MOS transistor 53. The operational amplifier 50 and the P-channel MOS transistor 53 construct a voltage follower which maintains the potential VDDP of the power supply node N53 at the same level as that of the potential VDDS+Vthp of the node N51.

Therefore, at the time of a burn-in test, the internal power supply potential VDDP becomes VRS'+Vthp. At the time of a normal operation, the internal power supply potential VDDP becomes equal to VRS+Vthp. The internal power supply potential VDDP is supplied to peripheral circuits such as the clock generating circuit 2 and the row and column address buffer 3. VDDP is set to be larger than VDDS to increase the operation speed of the peripheral circuit and for the reason that since the withstand voltage of a transistor in the peripheral circuit is set to be higher than that of a transistor in the sense amplifier 12 or the like, even when a high voltage is applied to the peripheral circuit, no problem occurs.

In short, in normal operation, VPP=VRS+2Vthn, VDDS=VRS, and VDDP=VRS+Vthp. At the time of the burn-in test, VPP=VCC, VDDS=VRS', and VDDP=VRS'+Vthp, and VRS is tuned.

In the first embodiment, at the time of the burn-in test, VPP=VCC and VDDS=VRS'. Consequently, VPP and VDDP can be set independently of each other. Occurrence of an early defective in a circuit portion to which VPP is applied and that in a circuit portion to which VDDS is applied can be separately accelerated, so that test efficiency is high.

Since it is sufficient to tune only the resistance value of the variable resistive element 92, as compared with the conventional technique in which the resistance values of the two variable resistive elements 92 and 97 have to be tuned, the work for the tuning is reduced.

Second Embodiment

In the first embodiment, by setting VDDP=VDDS+Vthp, the work of tuning is lessened. Since the access speed of the DRAM is determined by the internal power supply potential VDDP, when the highly accurate access speed is required, it is desirable to tune the internal power supply potential VDDP. The second embodiment solves this problem.

Figure 7:
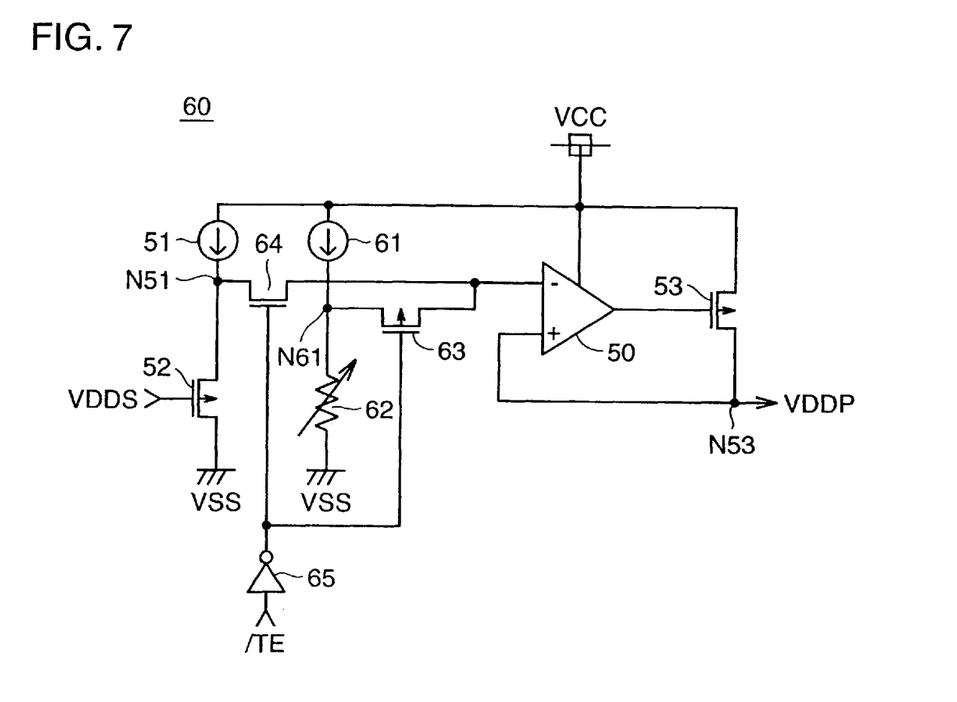
FIG. 7 is a circuit diagram showing the configuration of a VDDP generating circuit of a DRAM according to a second embodiment of the invention.

FIG. 7 is a circuit diagram showing the configuration of a VDDP generating circuit 60 of a DRAM according to the second embodiment of the invention. Referring to FIG. 7, the VDDP generating circuit 60 is different from the VDDP generating circuit 43 in FIG. 6 with respect to the point that a constant current source 61, a variable resistive element 62, a P-channel MOS transistor 63, an N-channel MOS transistor 64, and an inverter 65 are added.

The constant current source 61 and the variable resistive element 62 are connected in series between the line of the external power supply potential VCC and the line of the ground potential VSS. The P-channel MOS transistor 63 is connected between the node N61 positioned between the constant current source 61 and the variable resistive element 62 and the inversion input terminal of the operational amplifier 50. The N-channel MOS transistor 64 is connected between the node N51 and the inversion input terminal of the operational amplifier 50. The test signal /TE is supplied to the gates of the MOS transistors 63 and 64 via the inverter 65.

At the time of tuning, the test signal /TE is set to the "H" level as the inactivate level, the P-channel MOS transistor 63 is made conductive, the N-channel MOS transistor 64 is made non-conductive, and the potential of the node N61 is applied to the inversion input terminal of the operational amplifier 50. The resistance value of the variable resistive element 62 is tuned so that the internal power supply potential VDDP becomes equal to the predetermined value VRP.

At the time of the burn-in test, the test signal /TE is set to the "L" level as the activate level, the P-channel MOS transistor 63 is made nonconductive, the N-channel MOS transistor 64 is made conductive, and the potential VDDS+Vthp=VRS'+Vthp of the node N51 is applied to the inversion input terminal of the operational amplifier 50. Therefore, the internal power supply potential VDDP becomes equal to VRS'+Vthp.

In normal operation, the test signal /TE is set to the "H" level as the inactivate level, the P-channel MOS transistor is made conductive, the Nchannel MOS transistor 64 is made non-conductive, and the potential of the node N61 is applied to the inversion input terminal of the operational amplifier 50. The internal power supply potential VDDP therefore becomes equal to VRP. Since the other configuration and operation are the same as those of the first embodiment, their description will not be repeated.

In the second embodiment, in the normal operation, the tuned potential VDDP=VRP is supplied to the peripheral circuit. Consequently, the access speed can be set with high precision.

Third Embodiment

Figure 8:
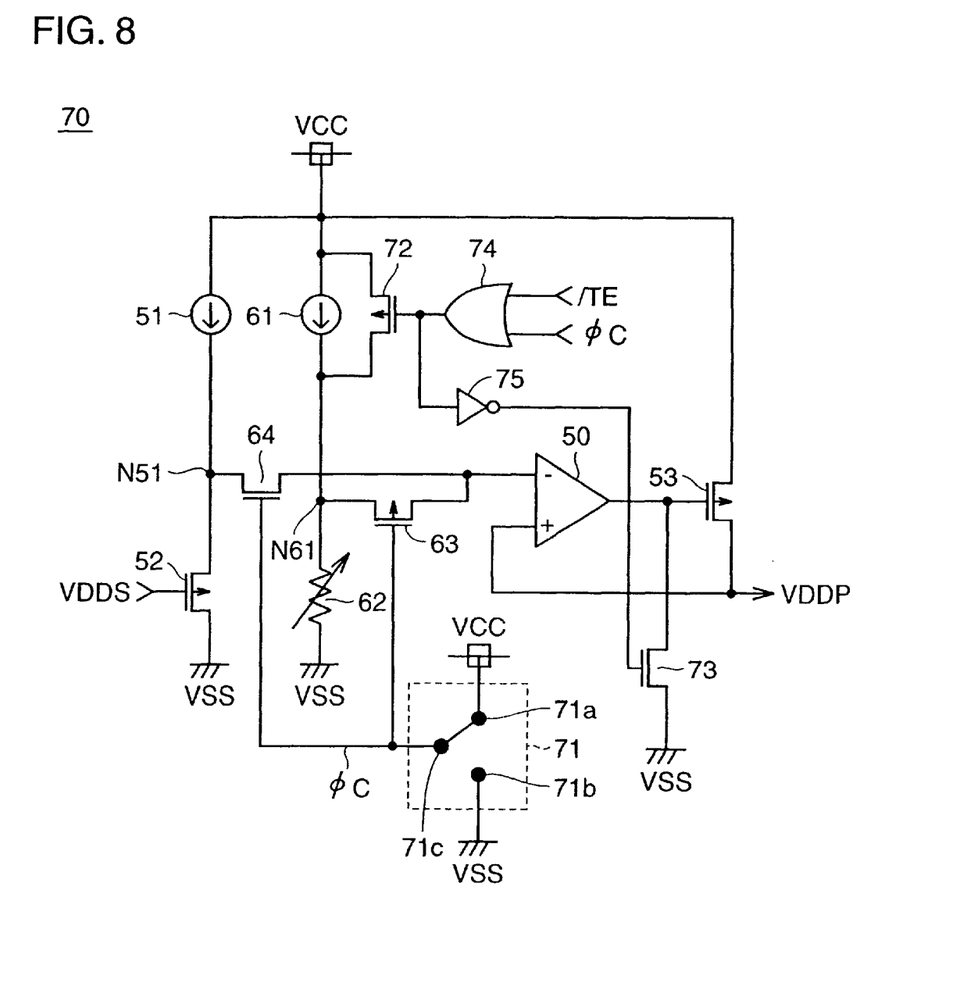
FIG. 8 is a circuit diagram showing the configuration of a VDDP generating circuit in a third embodiment of the invention.

FIG. 8 is a circuit diagram showing the configuration of a VDDP generating circuit 70 of a DRAM according to a third embodiment of the invention. Referring to FIG. 8, the VDDP generating circuit 70 is different from the VDDP generating circuit 60 in FIG. 7 with respect to the point that the inverter 65 is eliminated, and a change-over switch 71, a P-channel MOS transistor 72, an N-channel MOS transistor 73, an OR gate 74, and an inverter 75 are added.

The gates of the MOS transistors 63 and 64 are connected to a common terminal 71c of the change-over switch 71. One switch terminal 71a and the other switch terminal 71b of the change-over switch 71 receive the external power supply potential VCC and the ground potential VSS, respectively. The change-over switch 71 is switched by, for example, connection of a bonding wire, replacement of a contact mask, and the like. FIG. 8 shows a state where the terminals 71a and 71c are made conductive.

The P-channel MOS transistor 72 is connected in parallel with the constant current source 61. The N-channel MOS transistor 73 is connected between the gate of the P-channel MOS transistor 53 and the line of the ground potential VSS. The OR gate 74 receives both the test signal /TE and a signal φC appearing at the common terminal 71c of the change-over switch 71, and an output signal of the OR gate 74 is directly supplied to the gate of the P-channel MOS transistor 72 and also to the gate of the N-channel MOS transistor 73 via the inverter 75.

When the DRAM is not shipped as a model required to have high-precision access speed, the terminals 71a and 71c of the change-over switch 71 are connected. Consequently, the signal φC goes high, the N-channel MOS transistor 64 is made conductive, and the P-channel MOS transistor 63 is made non-conductive, so that the VDDP generating circuit 70 has the same configuration as that of the VDDP generating circuit 43 in FIG. 6. In this case, therefore, the same effects as those of the first embodiment can be produced.

When the DRAM is of a model required to have high-precision access speed, the terminals 71b and 71c of the change-over switch 71 are connected. Consequently, the signal φC goes low, the P-channel MOS transistor 63 is made conductive, and the N-channel MOS transistor 64 is made non-conductive, so that the VDDP generating circuit 70 comes to have the same configuration as that of the conventional VDDP generating circuit 83 in FIG. 13. In this case, therefore, the access speed can be set with high precision. Since the other configuration is the same as that of the second embodiment, the description will not be repeated.

Figure 9:
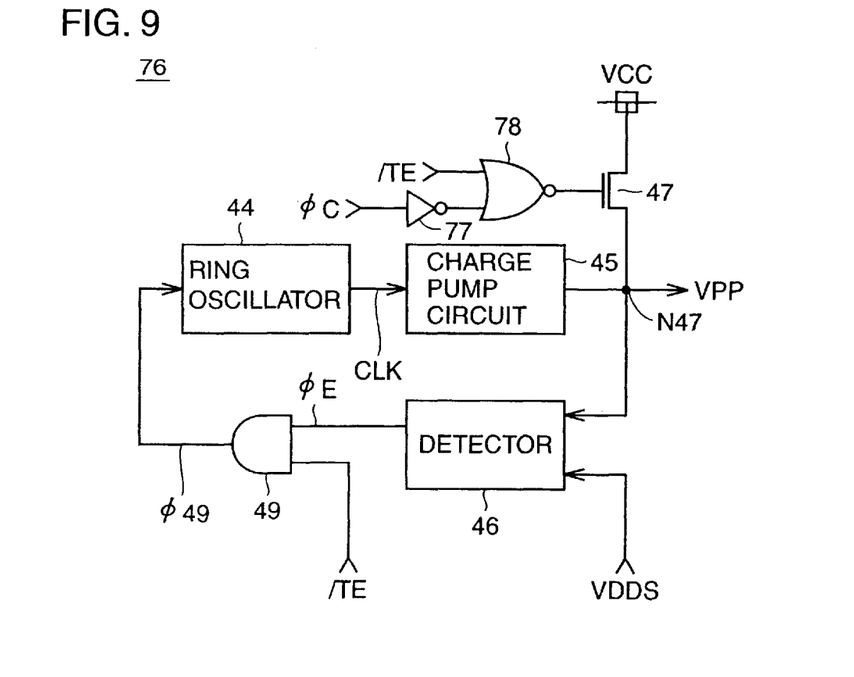
FIG. 9 is a circuit block diagram showing a modification of the third embodiment.

In the third embodiment, the VPP generating circuit 41 may be replaced by the VPP generating circuit 76 in FIG. 9. The VPP generating circuit 76 is different from the VPP generating circuit 41 in FIG. 5 with respect to the point that the inverter 48 is replaced by the inverter 77 and an NOR gate 78. The test signal /TE is supplied to one of input nodes of the NOR gate 78, the signal φC is supplied to the other input node of the NOR gate 78 via the inverter 77, and an output signal of the NOR gate 78 is supplied to the gate of the N-channel MOS transistor 47.

In the case where the signal φC is at the "H" level, the VPP generating circuit 76 has the same configuration as the VPP generating circuit 41 in FIG. 5. In the case where the signal φC is at the "L" level, the N-channel MOS transistor 47 is fixed to the non-conductive state, and the VPP generating circuit 76 has the same configuration as the conventional VPP generating circuit 80 in FIG. 11.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device driven by an external power supply potential, comprising:
   a first reference potential generating circuit of which output potential is adjustable, for outputting a first internal reference potential which is lower than said external power supply potential;

a first power supply circuit for maintaining a first power supply node at said first internal reference potential in a normal operation mode, and maintaining said first power supply node at an external reference potential in a test mode;

a second power supply circuit for maintaining a second power supply node at a boosted potential higher than said first internal reference potential by a predetermined first voltage in said normal operation mode, and supplying said external power supply potential to said second power supply node in said test mode;

a level shifting circuit for outputting a potential obtained by level-shifting the potential of said first power supply node by a predetermined second voltage to said external power supply potential side;

a third power supply circuit for maintaining a third power supply node at an output potential of said level shifting circuit; and an internal circuit for receiving a drive power from said first to third power supply circuits via said first to third power supply nodes and performing a predetermined operation.

2. The semiconductor device according to claim 1, wherein said first reference potential generating circuit includes:

a first constant current source connected between a line of said external power supply potential and a first output node, for supplying a predetermined first current to said first output node; and a first variable resistive element of which resistance value is adjustable, which is connected between said first output node and a line of a ground potential.

3. The semiconductor device according to claim 1, wherein said second power supply circuit includes:

a charge pump circuit which is activated when a potential of said second power supply node is lower than said boosted potential in said normal operation mode and supplies a current to said first power supply node; and a switching element which is connected between a line of said external power supply potential and said second power supply node and is made conductive in said test mode.

4. The semiconductor device according to claim 1, wherein said level shifting circuit includes:

a second constant current source which is connected between the line of said external power supply potential and a second output node and supplies a predetermined second current to said second output node; and a transistor connected between said second output node and the line of the ground potential, of which input electrode receives the potential of said first power supply node.

5. The semiconductor device according to claim 1, further comprising a second reference potential generating circuit of which output potential is adjustable, for outputting a second internal reference potential which lies between said external power supply potential and said first internal reference potential, wherein said third power supply circuit maintains said third power supply node at said second internal reference potential in said normal operation mode, and maintains said third power supply node at an output potential of said level shifting circuit in said test mode.

6. The semiconductor device according to claim 1, further comprising:

a second reference potential generating circuit of which output potential is adjustable, for outputting a second internal reference potential which lies between said external power supply potential and said first internal reference potential; and a selecting circuit for selecting either an output potential of said level shifting circuit or said second internal reference potential, wherein said third power supply circuit maintains said third power supply node at a potential selected by said selecting circuit.

7. The semiconductor device according to claim 6, wherein said second reference potential generating circuit includes:

a third constant current source connected between a line of said external power supply potential and a third output node, for supplying a predetermined third current to said third output node; and a second variable resistive element connected between said third output node and the line of the ground potential, of which resistance value is adjustable.

8. The semiconductor device according to claim 1, wherein said semiconductor device is a semiconductor memory device, said internal circuit includes:

a memory array including a plurality of memory cells arranged in a plurality of rows and in a plurality of columns, a plurality of wordlines provided in correspondence with said plurality of rows, and a plurality of bit line pairs provided in correspondence with said plurality of columns;

a sense amplifier provided in correspondence with each bit line pair, for amplifying a potential difference occurring between a corresponding pair of bit lines;

a row selecting circuit for selecting any of said plurality of wordlines in accordance with a row address signal and activating each memory cell corresponding to the selected wordline;

a column selecting circuit for selecting any of said plurality of bit line pairs in accordance with a column address signal; and a write/read circuit for writing/reading data to/from the memory cell activated by said row selecting circuit via the bit line pair selected by said column selecting circuit, wherein said sense amplifier receives a drive power from said first power supply circuit via said first power supply node, the wordline selected by said row selecting circuit receives a drive power from said second power supply circuit via said second power supply node, and said row selecting circuit, said column selecting circuit, and said write/read circuit receive a drive power from said third power supply circuit via said third power supply node.

* * * * *